(12) United States Patent
Tosaka et al.

(10) Patent No.: US 9,691,532 B2
(45) Date of Patent: Jun. 27, 2017

(54) CONNECTION STRUCTURE OF HIGH-TEMPERATURE SUPERCONDUCTING WIRE PIECE, HIGH-TEMPERATURE SUPERCONDUCTING WIRE USING CONNECTION STRUCTURE, AND HIGH-TEMPERATURE SUPERCONDUCTING COIL USING CONNECTION STRUCTURE

(71) Applicant: Kabushiki Kaisha Toshiba, Minato-Ku (JP)

(72) Inventors: Taizo Tosaka, Yokohama (JP); Hiroshi Miyazaki, Yokohama (JP); Sadanori Iwai, Kawasaki (JP); Shigeki Takayama, Yokohama (JP); Kei Koyanagi, Yokohama (JP); Kenji Tasaki, Nakano (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 177 days.

(21) Appl. No.: 15/042,449

(22) Filed: Feb. 12, 2016

(65) Prior Publication Data

US 2016/0240284 A1 Aug. 18, 2016

(30) Foreign Application Priority Data

Feb. 13, 2015 (JP) ................................. 2015-026789

(51) Int. Cl.
*H01F 6/06* (2006.01)
*H02G 15/34* (2006.01)
*H01R 4/68* (2006.01)

(52) U.S. Cl.
CPC ............. *H01F 6/065* (2013.01); *H02G 15/34* (2013.01); *H01R 4/68* (2013.01); *Y02E 40/648* (2013.01)

(58) Field of Classification Search
CPC .......... H01F 6/065; H02G 15/34; H01R 4/68; Y02E 40/648
See application file for complete search history.

(56) References Cited

U.S. PATENT DOCUMENTS 6,921,865 B2 * 7/2005 Morita .................... H01L 39/02
174/125.1
7,774,035 B2 8/2010 Lee et al.
(Continued)

FOREIGN PATENT DOCUMENTS

DE 10 2004 060 615 A1 9/2005
DE 11 2008 000 946 T5 3/2010
(Continued)

*Primary Examiner* — Colleen Dunn
(74) *Attorney, Agent, or Firm* — Oblon, McClelland, Maier & Neustadt, L.L.P.

(57) ABSTRACT

A connection structure of a multi-layer wire includes at least a substrate, a high-temperature superconducting layer, a tape-type laminated body, a conductor layer, and a passage forming body. The high-temperature superconducting layer is formed on one surface of the substrate. The tape-type laminated body including at least the substrate and the high-temperature superconducting layer. The conductor layer covering an outer periphery of the tape-type laminated body. The passage forming body serving as a flowing path of a superconducting current generated in the high-temperature superconducting wire piece. The passage forming body is bonded by a bonding material is arranged on a side surface of the conductor layer, the side surface being located on an opposite side to the high-temperature superconducting layer with respect to the substrate.

9 Claims, 11 Drawing Sheets

(56) References Cited

U.S. PATENT DOCUMENTS

| | | | |
|---|---|---|---|
| 7,792,560 B2 * | 9/2010 | Ekbote | H01L 39/2474 148/521 |
| 8,306,590 B2 * | 11/2012 | Ekbote | H01L 39/2474 174/125.1 |
| 2006/0073979 A1 | 4/2006 | Thieme et al. | |
| 2012/0065074 A1 | 3/2012 | Xie et al. | |
| 2013/0040819 A1 | 2/2013 | Haraguchi et al. | |
| 2013/0061458 A1 | 3/2013 | Lee et al. | |

FOREIGN PATENT DOCUMENTS

| | | |
|---|---|---|
| DE | 11 2012 002 309 T5 | 3/2014 |
| DE | 10 2013 220 142 A1 | 4/2015 |
| JP | 2000-133067 | 5/2000 |

\* cited by examiner

CONVENTIONAL EXAMPLE

CONNECTION STRUCTURE OF HIGH-TEMPERATURE SUPERCONDUCTING WIRE PIECE, HIGH-TEMPERATURE SUPERCONDUCTING WIRE USING CONNECTION STRUCTURE, AND HIGH-TEMPERATURE SUPERCONDUCTING COIL USING CONNECTION STRUCTURE

CROSS-REFERENCE TO RELATED APPLICATION

This application is based upon and claims the benefit of priority from Japanese Patent application No. 2015-026789, filed on 13 Feb., 2015, the entire content of which is incorporated herein by reference.

BACKGROUND

Technical Field

Embodiments described herein relate to a technique for connecting multi-layer wire pieces each of which is formed of a laminated thin layer and formed into a tape shape.

Description of the Related Art

In recent years, the study of a high-temperature superconducting coil, using a high-temperature superconducting wire represented by a REBCO wire using $(RE)Ba_2Cu_3O_7$ including rare earth (RE), has been actively conducted.

Especially, a high-temperature superconducting wire (hereinafter referred to as "multi-layer wire"), manufactured by composing a plurality of types of layers on a substrate having a thickness of about 100 μm, has the characteristic of having a large current capacity under a high magnetic field.

The multi-layer wire has the characteristic of not losing superconducting properties even when receiving high stress in the tape longitudinal direction.

It is expected to realize a high-temperature superconducting coil which allows high stress and high current density required to generate a high magnetic field.

When the multi-layer wire is applied for a MRI magnet, a magnet for a single crystal pulling apparatus, an accelerator magnet, and the like, the wire length required for the magnet becomes several [km] to several hundreds of km.

Since a high-temperature superconducting layer requires high crystallinity, it is difficult to obtain a long multi-layer wire. Under the present circumstances, the length of a single multi-layer wire ranges from several tens [m] to several hundred [m].

Pluralities of the pieces are needed when a high-temperature superconducting coil is manufactured by connecting the multi-layer wire pieces.

At present, many kinds of efforts is made for the multi-layer wire pieces have been used to reduce the connection resistance as much as possible, since a method for zero-resistance connection, so-called superconducting connection, has not been established.

Each of top and bottom layers constituting the layers of the multi-layer wire is usually a stabilizing layer formed by plating, such as copper plating.

A superconducting current flowing through the high-temperature superconducting layer more easily flows into the stabilizing layer located on the same side as the superconducting layer with respect to the substrate, where the side of this stabilizing layer is hereinafter referred to as "obverse".

The obverses of them are bonded to reduce resistance when multi-layer wires are extended by being connected to each other by solder.

Similarly, when the multi-layer wire is connected to a normal conductor, such as an electrode, the connection resistance is reduced by connecting the obverse to the normal conductor.

It should be noted that the heat which is generated when the superconducting current flows through the normal conductor such as solder has almost no effect on the superconductivity of the high-temperature superconducting wire.

That is, the density of the heat which the normal conductor generates is low, and hence, when the superconducting coil is sufficiently cooled, the function of the superconducting coil is not lost.

However, when the superconducting layer is destroyed, the density of the heat generated at the destroyed portion is significantly increased.

It is difficult to keep the destroyed portion at a low temperature by cooling in a refrigerator or the like, and hence it is considered that the thermal runaway occurs. For example, see Patent Documents: Japanese Patent Applied-Open No. 2000-133067, No. 2008-140930 and No. 2011-018536.

As described above, as for the superconducting properties, the multi-layer wire has an advantage of having a high allowable stress in the so-called tape longitudinal direction.

However, it is confirmed that, when the multi-layer wire is connected by soldered on the obverse, the allowable stress in the tape longitudinal direction is reduced.

It is found that the reduction of the allowable stress is due to the concentration of stress at the connection end portion.

The multi-layer wire generally has a high allowable stress in the tape longitudinal direction, but on the other hand, has a low allowable stress in the direction in which the layers composing the multi-layer wire are peeled off (hereinafter referred to as "peeling direction").

The reduction of the allowable stress in the tape longitudinal direction is due to the fact that, when a pulling force is applied in the tape longitudinal direction, stress is concentrated at small portions at both ends of the connecting portion.

It is expected that a part of the concentrated stress becomes a stress component in the peeling direction (hereinafter referred to as "peeling stress"), which destroys the laminated body including the superconducting layer.

As described above, the destruction of the laminated body may lead to thermal runaway.

The high-temperature superconducting coil composed of the multi-layer wire pieces usually cannot perform the function as the superconducting coil, when, even in a part of the multi-layer wire pieces, the superconductivity is lost due to the thermal runaway or the like.

On the other hand, in the case where the outer periphery of the multi-layer wire is reinforced with a high-strength and high-electrical-resistance material, the allowable stress of the thin layer in the tape longitudinal direction is not reduced even when the multi-layer wire pieces are connected to each other.

This is because, since the peeling stress generated at both ends of the connecting portion is imposed to the reinforcing material, the superconducting layer in the multi-layer wire is hardly affected by the peeling stress.

Once the outer periphery of the multi-layer wire is reinforced, however, the cross-sectional area of the multi-layer wire with respect to the current-carrying capacity is increased, and thereby the current density of the high-temperature superconducting coil as a whole is reduced.

The reduction of the current density is disadvantageous from the viewpoint of effectively generating a high magnetic field.

SUMMARY

Embodiments of the present invention have been implemented in view of the above circumstances and have an object to provide a connection structure of high-temperature superconducting wire piece, which structure prevents that the allowable stress of the high-temperature superconducting wire piece is reduced due to extension or connection of high-temperature superconducting wire piece, and is to provide a high-temperature superconducting wire using the connection structure, and a high-temperature superconducting coil using the connection structure.

The above and other objects can be achieved according to the embodiments by providing a connection structure of a high-temperature superconducting wire piece according to an embodiment of the present invention, in which structure the outer periphery of a tape-type laminated body, including at least a substrate, and a high-temperature superconducting layer formed on one surface of the substrate, is covered with a conductor layer, wherein a passage forming body, serving as a flowing path of a superconducting current generated in the high-temperature superconducting wire piece, is bonded by a bonding material arranged on the side surface of the conductor layer located on the opposite side to the superconducting layer with respect to the substrate.

DETAILED DESCRIPTION

The present embodiments are described hereinafter with reference to the accompanying drawings.

In the first place, a configuration of a tape-type high-temperature superconducting wire 20 (hereinafter referred to as "multi-layer wire 20") composing a layer structure will be described with reference to FIG. 1.

Figure 1:
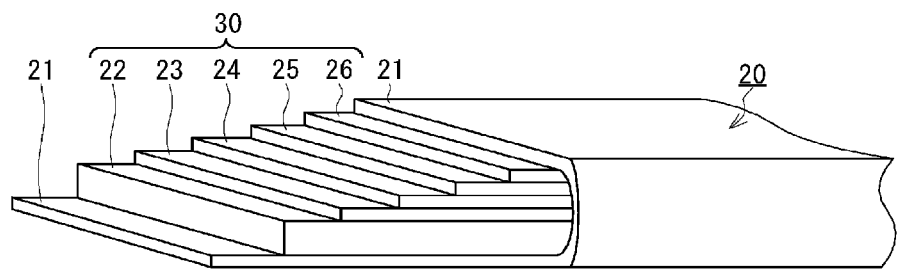
FIG. 1 is a perspective view showing a configuration of a commonly used multi-layer wire.

FIG. 1 is a perspective view showing a configuration of a common multi-layer wire 20.

The multi-layer wire 20 is a wire, such as a REBCO wire including a high-temperature superconducting layer 25 (hereinafter referred to as "superconducting layer 25") made of, for example, RE oxide.

The multi-layer wire 20 is configured by a substrate 22 which is made of a high-strength metallic material such as a nickel-based alloy, stainless steel or copper, an intermediate layer 24 which prevents heat distortion caused by thermal contraction of the substrate 22 and the superconducting layer 25 formed on the substrate 22, an alignment layer 23 which aligns the intermediate layer 24 on the surface of the substrate 22 and is made of magnesium or the like, the superconducting layer 25 which is formed on the intermediate layer 24 and made of an oxide, a protective layer 26 which is formed of silver, gold, platinum or the like and protects the superconducting layer 25 by preventing oxygen contained in the superconducting layer 25 from diffusing from the superconducting layer 25 and a stabilizing layer 21 which is made of a good conductive metal such as copper, aluminum or the like and serves as a alternate path that prevents an excess superconducting current from flowing into the superconducting layer 25 and thereby prevents the occurrence of a quenching phenomenon.

The type and number of the layers respectively composing the multi-layer wire 20 are not limited to this configuration and may be more or less as required.

First Embodiment

Figure 2:
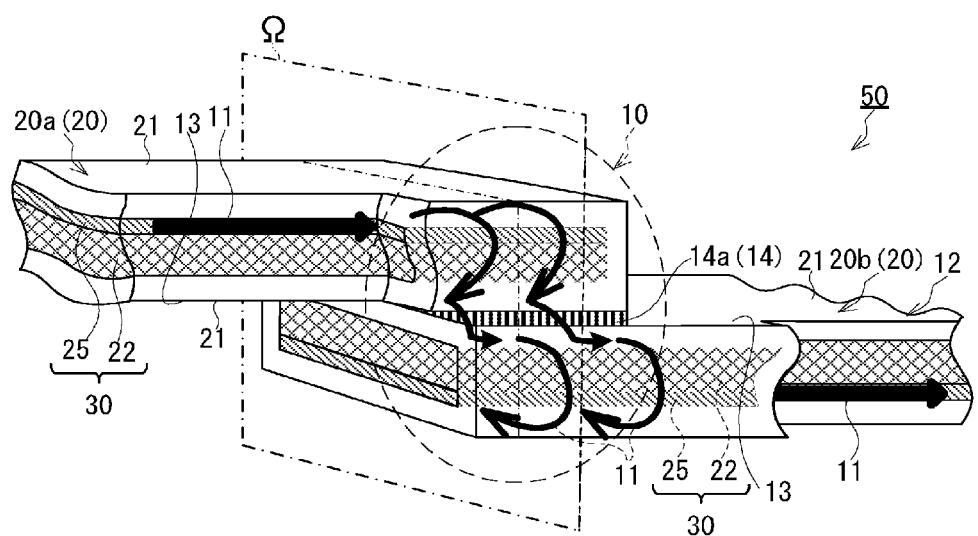
FIG. 2 is a perspective view showing two multi-layer wire pieces connected by using a connection structure of the multi-layer wire pieces according to a first embodiment.

FIG. 2 is a perspective view of two pieces of the multi-layer wire 20 connected to each other by using a connection structure 10 of the multi-layer wire pieces (hereinafter referred to as "connection structure 10") according to a first embodiment.

In FIG. 2, a part of the multi-layer wire 20 has a cross-section taken in the tape longitudinal direction.

Among layers composing a laminated body 30 in each of the views of FIG. 2 and subsequent figures, layers, other than the substrate 22 and the superconducting layer 25 which are essential to the embodiments, are omitted in order to simplify the description.

As shown in FIG. 2, the connection structure 10 according to the first embodiment is configured such that the outer periphery of the tape-type laminated body 30 (shown in FIG. 1), which includes, at least the substrate 22 and the superconducting layer 25 formed on one surface of the substrate 22, is covered with the conductor layer 21, and such that a passage forming body 12, which serves as a flowing path of a superconducting current 11 generated in the multi-layer wire 20 (hereinafter, if necessary, referred to as "first wire 20a"), is bonded by a bonding material 14 arranged on a side surface 13 (hereinafter referred to as "reverse 13") of the conductor layer 21 on the opposite side to the superconducting layer 25 with respect to the substrate 22.

In the example shown in FIG. 1, the laminated body 30 includes the substrate 22, the alignment layer 23, the intermediate layer 24, the superconducting layer 25, and the protective layer 26.

The conductor layer 21 covering the outer periphery of the laminated body 30 is usually the stabilizing layer 21.

The passage forming body 12 in the first embodiment is a second multi-layer wire 20b (20) which is formed by covering the laminated body 30 with the conductor layer 21 similarly to the first wire 20a.

The reverse 13 of the second wire 20b is arranged so as to face the reverse 13 of the first wire 20a.

In addition, the leading end of the reverse 13 of the first wire 20a facing the tail end of the reverse 13 of the second wire 20b are bonded to each other by the bonding materials 14 such as a solder 14a (14).

Figure 3:
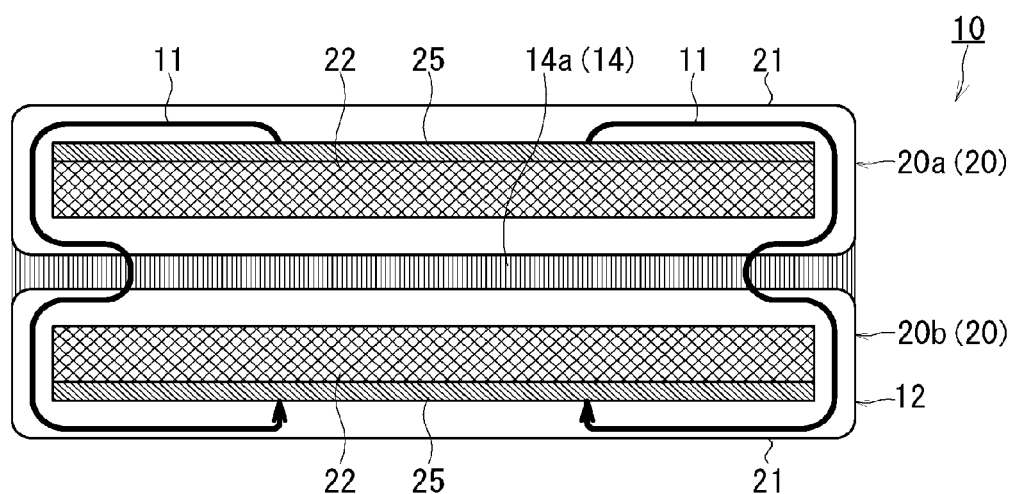
FIG. 3 is a cross-sectional view taken along the cutting plane in FIG. 1 of the connecting structure of the multi-layer wire according to the first embodiment.

FIG. 3 is a cross-sectional view taken along a plane Ω (FIG. 2) set in the tape width direction of the connection structure 10 according to the first embodiment of FIG. 2.

The intermediate layer 24 (shown in FIG. 1) which separates the substrate 22 from the superconducting layer 25 is generally an electrically insulating body.

The superconducting current 11 flowing through the superconducting layer 25 cannot traverse the intermediate layer 24 to flow to the reverse 13.

The first wire 20a and the second wire 20b in the first embodiment, however, are formed in such a manner that the stabilizing layer 21 covers the outer periphery of the laminated body 30 as shown in FIG. 2 and FIG. 3.

The superconducting current 11 flowing through the superconducting layer 25 of the first wire 20a flows through the bypass path formed by the stabilizing layer 21 and flows into the reverse 13 as shown in FIG. 3.

Similarly, the superconducting current 11 flowing from the reverse 13 of the first wire 20a to the reverse 13 of the second wire 20b flows through the bypass path formed by the stabilizing layer 21 and flows into the superconducting layer 25.

The superconducting current 11 flowing through the first wire 20a flows into the second wire 20b via the solder 14a and flows through the second wire 20b.

That is, the first wire 20a and the second wire 20b as a whole which are bonded to each other in this way is one high-temperature superconducting wire 50.

Figure 4:
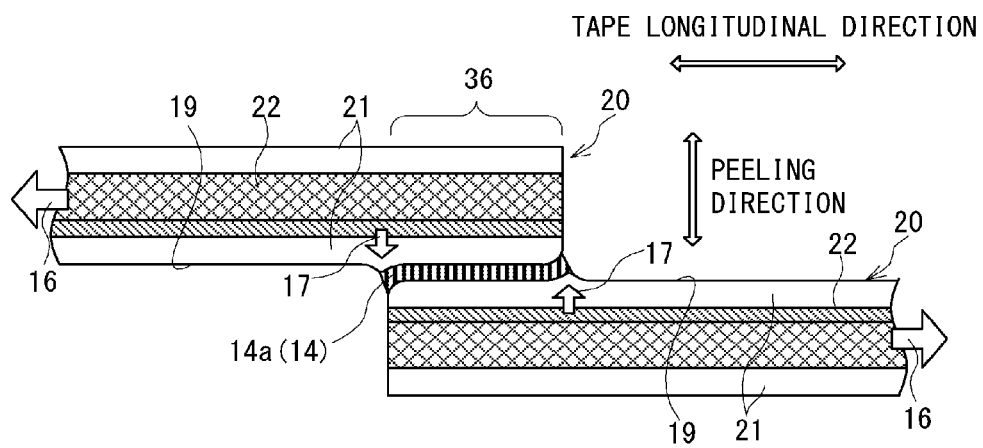
FIG. 4 is a view showing peeling stress generated when pulling force in the tape longitudinal direction is applied to the conventional connection structure of the multi-layer wire.

FIG. 4 is a view showing peeling stress 17 generated when pulling force 16 is applied in the tape longitudinal direction in the conventional connection structure.

That is, FIG. 4 is a view showing a state where side surfaces 19 (hereinafter referred to as "obverses 19") of the stabilizing layers 21, each of which is located on the same side as the superconducting layer 25 with respect to the substrate 22, are oppposingly connected to each other.

When the pulling force 16 is applied in the tape longitudinal direction, a local deformation is generated at each end portion of a region 36 (hereinafter referred to as "connection region 36") where the leading end of the first wire 20a is connected to the tail end of the second wire 20b.

A part of the components of the stress concentrated at each end portion of the connection region 36 deformed by the pulling force 16 becomes the stress 17 (peeling stress 17) which peels the multi-layer wire 20 in the laminating direction.

The stabilizing layer 21 which is a relatively soft low-resistance metal such as copper, formed to have a thickness of tens of μm has low mechanical strength and hence transmits the peeling stress 17 to the laminated body 30.

Since multi-layer wires are bonded conventionally by soldering each obverse 19 of them, the superconducting layer 25 which is arranged on the same side of the obverses 19 with respect to the substrate 22 is greatly affected by the peeling stress 17.

As described above, the superconducting layer 25, the intermediate layer 24 or the like of the laminated bodies 30 has an allowable stress extremely low in the peel direction, and hence is easily destroyed by the peeling stress 17.

Figure 5:
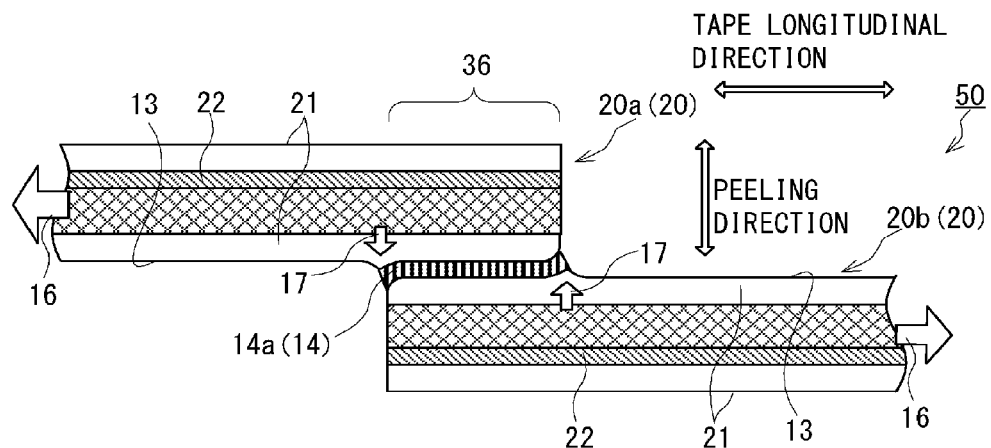
FIG. 5 is a view showing peeling stress generated when pulling force in the tape longitudinal direction is applied to the connection structure of the multi-layer wire pieces according to the first embodiment.

On the other hand, FIG. 5 is a view showing the peeling stress 17 generated when the pulling force 16 in the tape longitudinal direction is applied to the connection structure 10 according to the first embodiment.

When the pieces of the multi-layer wire 20 are connected to each other in the connection structures 10, the substrate 22 is arranged between the superconducting layers 25 and the stabilizing layer 21 located on the reverse 13 provided with the solder 14a.

The substrate 22 has a thickness of one hundred μm which is several times the thickness of the stabilizing layer 21, and the substrate 22 is composed of a hard and high strength material such as a Ni-based alloy.

The influence of the stress on the superconducting layer 25 is very small, even when the stress is concentrated on a part of the connection region 36.

That is, with the connection structure 10 according to the first embodiment, it is possible to prevent that the allowable stress of the high-temperature superconducting wire 50 in the tape longitudinal direction is reduced by the electrical connection between the multi-layer wires 20.

Note that although the conductor layer 21 is explained as the stabilizing layer 21, the multi-layer wire 20 to which the connection structure 10 is suitably applied is not limited to the case in which the laminated body 30 is covered with the stabilizing layer 21.

Figure 6:
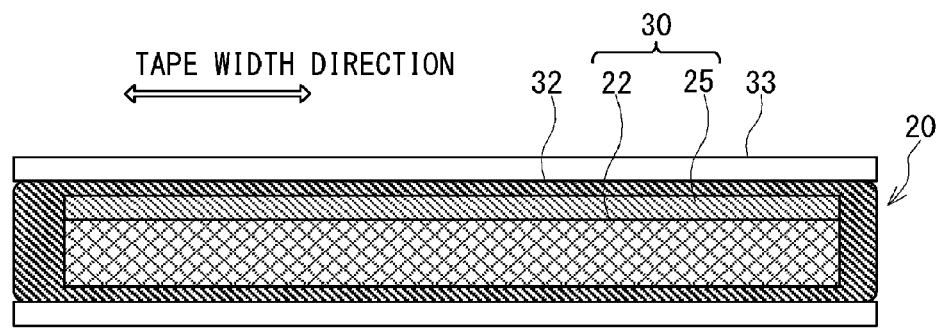
FIG. 6 is a cross-sectional view in the tape width direction of a multi-layer wire suitable for application of the connection structure of multi-layer wire according to the first embodiment.
Figure 7:
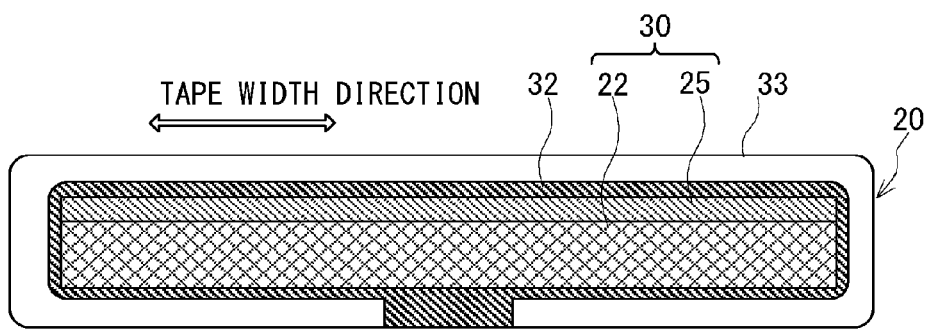
FIG. 7 is a cross-sectional view in the tape width direction of a multi-layer wire suitable for application of the connection structure of multi-layer wire according to the first embodiment.

For example, each of FIG. 6 and FIG. 7 is a tape width direction sectional view of the multi-layer wire 20 to which the connection structure 10 according to the first embodiment is suitably applied.

As shown in FIG. 6, it is possible that a low resistance metal tape 33 is bonded to both sides of the laminated body 30 by a soldering material 32 or the like so as to serve as the conductor layer 21 covering the laminated body 30 as a whole.

It is also possible that the laminated body 30 is enclose by the metal tape 33, and the metal tape 33 is fixed to the laminated body 30 by the soldering material 32 as shown in FIG. 7.

That is, the connection structure 10 can be suitably applied to the multi-layer wire 20 as long as the multi-layer wire 20 has a bypass path which is connected to the superconducting layer 25 and which enables the superconducting current 11 to bypass the laminated body 30.

As described above, with the connection structure 10 according to the first embodiment, it is possible to prevent that the allowable stress of the high-temperature superconducting wire 50 in the tape longitudinal direction is reduced by the electrical connection between the multi-layer wire pieces 20.

Second Embodiment

Figure 8:
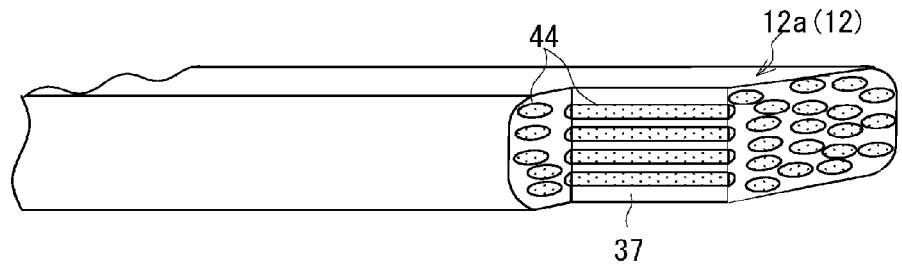
FIG. 8 is a sectional perspective view of a high-temperature superconducting silver sheathed wire used as a passage forming body in a second embodiment.

FIG. 8 is a sectional perspective view of a high-temperature superconducting silver sheathed wire 12a (12) used as a passage forming body 12 in a second embodiment.

It should be noted that FIG. 8 is also a cross-sectional view taken in the tape longitudinal direction of a part of the tape-type silver sheathed wire 12a.

Figure 9:
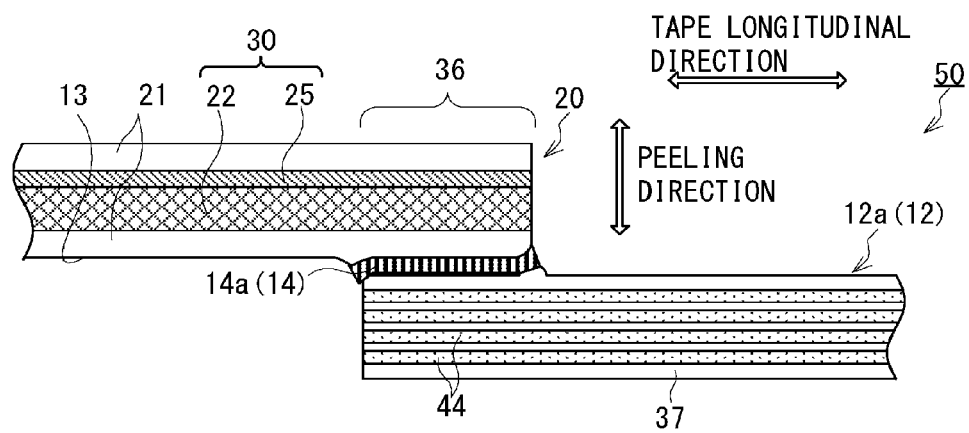
FIG. 9 is a tape longitudinal sectional view showing a connection portion of the high-temperature superconducting wire using a multi-layer wire connection structure according to the second embodiment.

FIG. 9 is a tape longitudinal sectional view showing a connection portion of a high-temperature superconducting wire 50 using a connection structure 10 according to the second embodiment.

As shown in FIG. 8 or FIG. 9, in the passage forming body 12 to which the connection structure 10 according to the second embodiment is applied a silver sheathed wire 12a is used instead of the second wire 20b as the multi-layer wire 20 of the first embodiment.

The silver sheathed wire 12a has a structure very different from the laminated structure of the multi-layer wire 20 and is configured such that superconducting filaments 44 are embedded in a silver matrix 37 as a base material.

The silver sheathed wire 12a does not have a laminated structure and hence has a high allowable stress in the peeling direction.

$Bi_2Sr_2Ca_2Cu_3O_{10}$ is generally used as the material of the superconducting filament 44.

The multi-layer wire 20 has a characteristic enabling a superconducting current 11 having a very high current density to flow therethrough.

One high-temperature superconducting wire 50, however, may not be configured uniformly by the multi-layer wire pieces 20.

Figure 10:
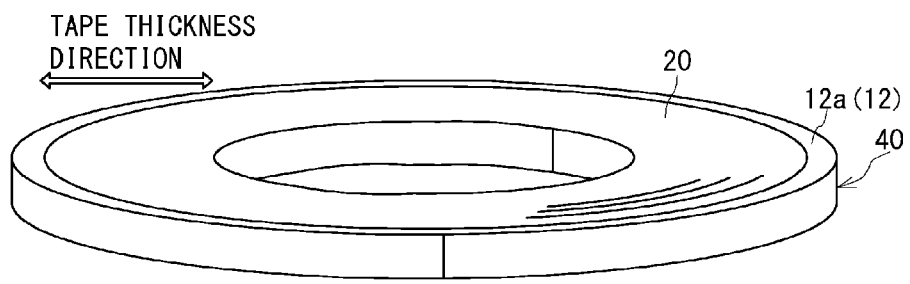
FIG. 10 is a perspective view showing a pancake coil manufactured by winding the high-temperature superconducting wire with the silver sheathed wire being connected to the multi-layer wire.

For example, FIG. 10 is a perspective view showing a pancake coil 40 manufactured by winding the high-temperature superconducting wire 50 having the silver sheathed wire 12a connected to the multi-layer wire 20.

A large deformation is generated in the outer peripheral portion of the pancake coil 40 by an external magnetic field.

It is preferred in some case to arrange the silver sheathed wire 12a instead of the multi-layer wire 20 having a small allowable stress in the peeling direction as shown in FIG. 10.

The stress applied to each of the stacked pancake coils 40 is different depending on the position of the pancake coil 40 in a high-temperature superconducting coil 60 (shown in FIG. 14) configured by stacking a plurality of the pancake coils 40, and so in some cases, it is preferred that in accordance with the environment in which the high-temperature superconducting wire 50 is used the multi-layer wire 20 is combined with another high-temperature superconducting wire such as the silver sheathed wire 12a.

Therefore, in the second embodiment, the multi-layer wire 20 and the silver sheathed wire 12a are connected with each other by using the connection structure 10.

Unlike the case of the multi-layer wire 20, the obverse 19 and reverse 13 of the silver sheathed wire 12a usually need not be distinguished.

Unlike the case of the multi-layer wire 20, the silver sheathed wire 12a is not provided with the intermediate layer 24 as the electrically insulating body, and hence enables a current to flow with low electrical resistance in the direction vertically passing through the tape wide surface (in the tape thickness direction).

Figure 11:
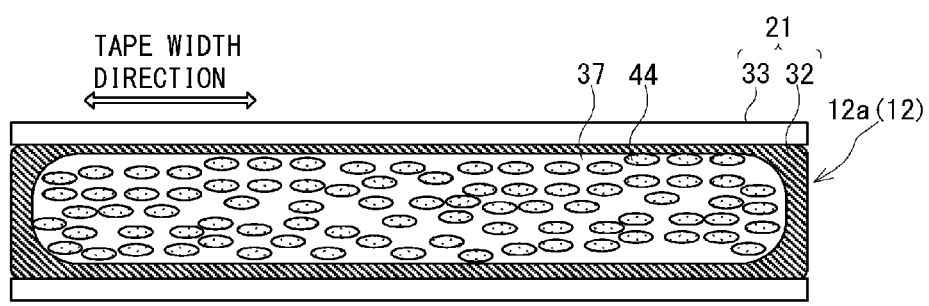
FIG. 11 is a tape width direction sectional view showing a modification of the silver sheathed wire used in the second embodiment.

FIG. 11 is a tape width direction sectional view showing a modification of the silver sheathed wire 12a used in the second embodiment.

The silver sheathed wire 12a whose outer periphery is reinforced with a soldering material 32 or a metal tape 33 is used as shown in FIG. 11.

Note that except that the silver sheathed wire 12a is used instead of the second wire 20b, the second embodiment has the same structure and the same operating procedures as those of the first embodiment, and hence the duplicate description thereof is omitted.

In the figures, the portions having common configurations or functions are denoted by the same reference numerals and characters, and the duplicate description thereof is omitted.

In this way, the same effects as in the first embodiment can be obtained when the multi-layer wire 20 is connected to a high-temperature superconducting wire other than the multi-layer wire 20 with the connection structure 10 according to the second embodiment.

That is, the high-temperature superconducting wire 50, having a configuration according to the environment in which the high-temperature superconducting wire 50 is used, can be manufacture while obtaining the effects of the first embodiment.

Third Embodiment

Figure 12:
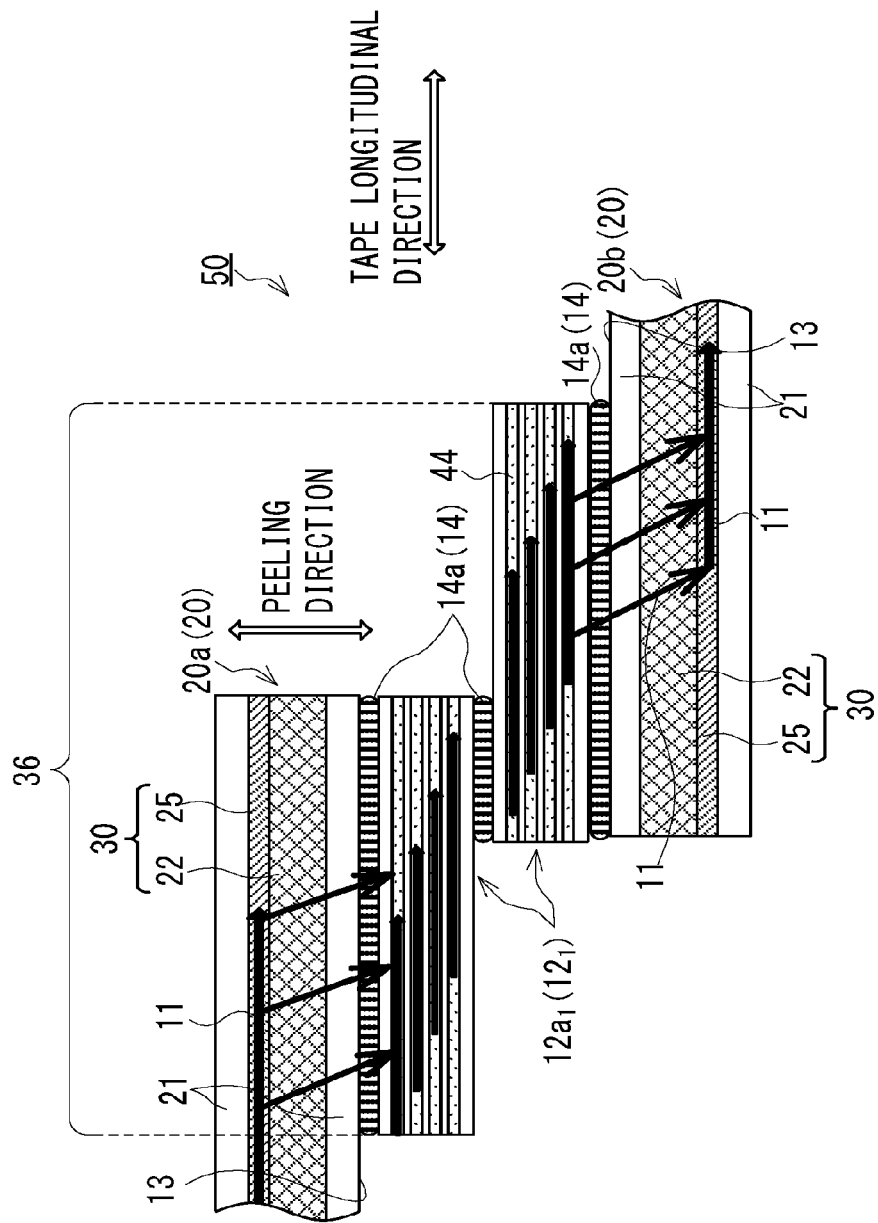
FIG. 12 is a tape longitudinal sectional view showing a connection portion of a high-temperature superconducting wire using a multi-layer wire connection structure according to a third embodiment.

FIG. 12 is a tape longitudinal sectional view showing a connection portion of a high-temperature superconducting wire 50 using a connection structure 10 according to a third embodiment.

Figure 13:
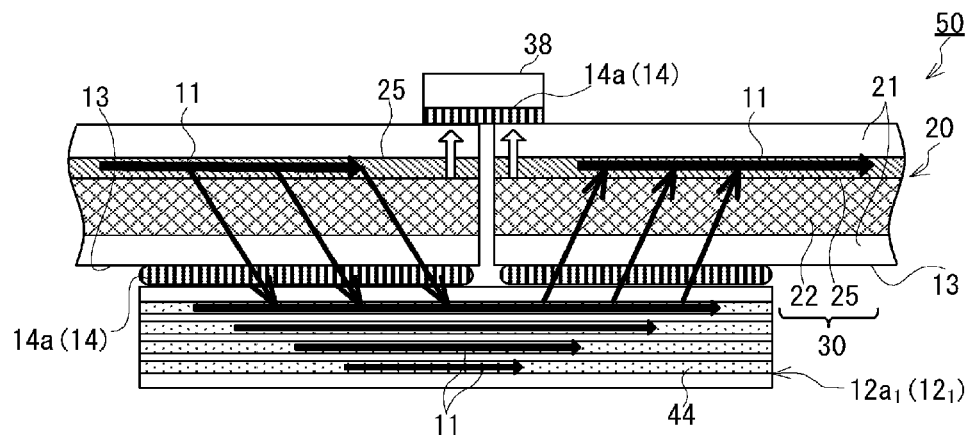
FIG. 13 is a tape longitudinal sectional view showing a modification of the connection portion of the high-temperature superconducting wire using the multi-layer wire connection structure according to the third embodiment.

FIG. 13 is a tape longitudinal sectional view showing a modification of the connection portion of the high-temperature superconducting wire 50 using the connection structure 10 according to the third embodiment.

It should be noted that the two-dimensional plane of each of FIG. 12 and FIG. 13 is shown as if a superconducting current 11 traverses a laminated body 30, but in the actual three-dimensional space, the superconducting current 11 flows through a bypass path of a stabilizing layer 21.

As shown in FIG. 12 and FIG. 13, a passage forming body 12 of the connection structure 10 according to the third embodiment is a wire piece $12_1$ (12) in which a tape longitudinal length (hereinafter referred to as "wire piece length") of a multi-layer wire 20 is 50 times or less than the length in the direction perpendicular to the tape longitudinal direction (hereinafter referred to as "wire piece width").

The wire piece $12_1$ used in the connection portion usually has the wire piece length about 50-100 mm, 10-20 times as much as wire piece width.

The wire piece $12_1$ is connected to a reverse 13 of a second wire 20b via a solder 14a.

The electrical resistivity of copper or the like used for the stabilizing layer 21 is generally lower than the electrical resistivity of the material used for the solder 14a.

The value of "length/cross-sectional area" of the bypass path formed by the stabilizing layer 21 is, however, larger by several orders than the value of "length/cross-sectional area" of the path of the solder 14a which the superconducting current 11 flows into.

The electrical internal resistance in the multi-layer wire 20 is more dominant than the electrical resistance of the solder 14a in the connection resistance at the time of using the connection structure 10.

The region which serves as the bypass path of the stabilizing layers 21 needs to be expanded by enlarging a connection region 36 as much as possible in order to reduce the connection resistance.

The value of "length/cross-sectional area" can be reduced by enlarging the substantial cross-sectional area of the bypass path.

In the third embodiment, therefore, the wire piece $12_1$ is used so that the connection length between the wire piece $12_1$ and the multi-layer wire 20 can be extended and thereby the connection region 36 between the first wire 20a and the second wire 20b can be enlarged.

The silver sheathed wire $12a_1$ ($21_1$) described above is preferably used as the wire piece $12_1$.

As described above, the silver sheathed wire $12a_1$ enables the superconducting current 11 to flow also in the tape thickness direction with a low electrical resistance.

Therefore, even when the connection area between the silver sheathed wires $12a_1$ is small, the small connection resistance between the silver sheathed wires $12a_1$ is obtained.

It is not necessary that the superconducting current 11 bypasses the intermediate layer 24 when the superconducting current 11 traverses the silver sheathed wire $12a_1$, while it is necessary when the bridge connection is provided with the pieces of the multi-layer wire 20 having the same length.

That is, when the silver sheathed wire $12a_1$ is used as the wire piece $12_1$, the bypass path can be shortened to thereby reduce the connection resistance as compared with the case where the bridge connection is provided with the multi-layer wire pieces 20.

Specifically, as shown in FIG. 12 and FIG. 13, the connection structure 10 using the wire piece $12_1$ can be roughly classified into two types.

FIG. 12 shows the case where the reverse 13 of the first wire 20a and the reverse 13 of the second wire 20b are made to face each other, and the reverses 13 facing each other are connected to each other by the wire piece $12_1$.

FIG. 13 shows the case where the first wire 20a and the second wire 20b, whose reverses 13 are oriented in the same direction, are arranged side by side, and the reverses 13 arranged side by side are bridge-connected to each other by the wire piece $12_1$.

As shown in FIG. 13, when the reverses 13 are bridge-connected to each other by the wire piece $12_1$, the direction of the reverse 13 of the first wire 20a and the second wire 20b can be oriented in the same direction.

Especially, this connection structure is effective when the direction of a superconducting layer 25 is needed to be considered, such as when it is desired that electromagnetic force applied to the superconducting layer 25 acts in the direction of pressing a substrate 22.

Note that, a portion in which the pieces of the multi-layer wire 20 are mutually connected only by the silver sheathed wire $12a_1$ and do not overlap each other becomes defects in terms of mechanical strength for the high-temperature superconducting wire 50 when only the silver sheathed wire $12a_1$ is used in the bridge connection.

The portion may be reinforced by connecting a reinforcing material 38 to the stabilizing layer 21 located on the obverse 19 of the multi-layer wire 20 as shown in FIG. 13.

When the portion is reinforced by the reinforcing material 38 in this way, peeling stress 17 may be generated and applied to the laminated body 30 at both ends of the reinforcing material 38.

The superconducting current 11 flows through the silver sheathed wire $12a_1$ so as to bypass the portions, and hence the function as the superconducting wire is not lost even when the laminated body 30 is destroyed at both end portions of the reinforcing material 38.

With the third embodiment as described above, the bypass path can be substantially extended by enlarging the connection region 36 with the use of the wire piece $12_1$, and thereby the value of "length/cross-sectional area" corresponding to the connecting resistance can be reduced.

Further, even when the bridge connection is reinforced by connection with the reinforcing material 38, the function as the superconducting wire is not lost.

It should be noted that, except that the connection structure 10 of the first embodiment is provided with the wire piece $12_1$, the third embodiment has the same structure and the same operating procedures as those of the first embodiment, and hence the duplicate description thereof is omitted.

In the figures, the portions having common configurations or functions are denoted by the same reference numerals and characters, and the duplicate description thereof is omitted.

In this way, with the connection structure 10 according to the third embodiment, the connection region 36 can be enlarged by using the wire piece $12_1$, and hence the bypass path as a part of the stabilizing layer 21 can be substantially enlarged.

That is, with the connection structure 10 according to the third embodiment, it is possible to obtain the effect of reducing the connecting resistance of the multi-layer wire 20 in addition to the effect obtained in the first embodiment.

Further, when the wire piece $12_1$ is used, the reverses 13 of two the pieces of multi-layer wire 20 can be arranged to face the same direction, and thereby the freedom of design can be increased.

Fourth Embodiment

Figure 14:
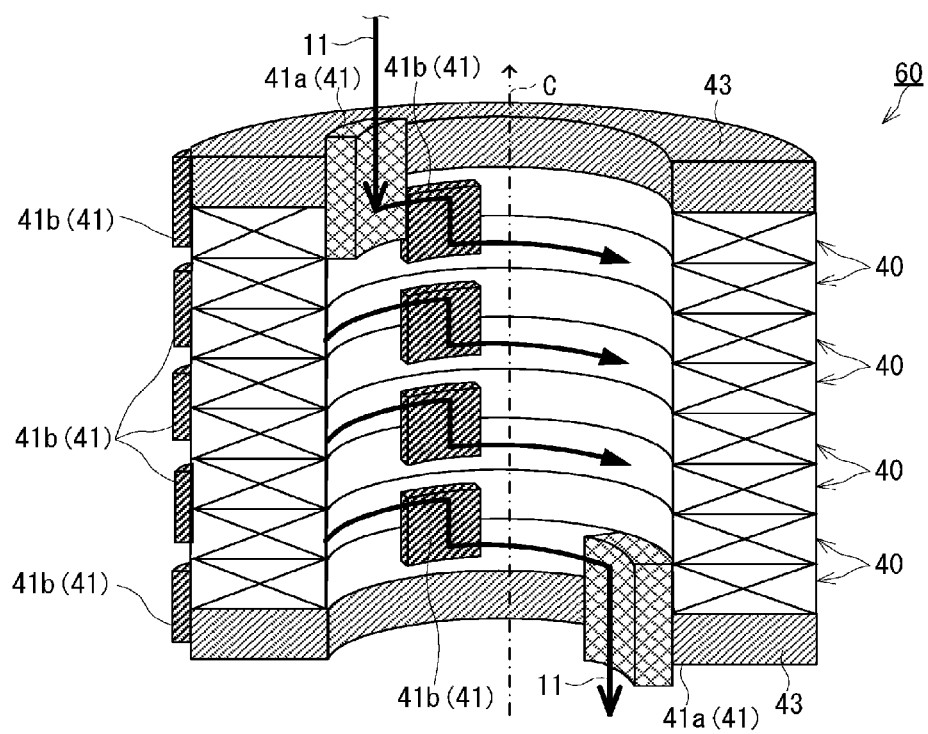
FIG. 14 is a view showing an example of a passage forming body lay on the high temperature superconducting coil.

FIG. 14 is a section perspective view showing an example of a passage forming body 12 lay on a high-temperature superconducting coil 60.

As shown in FIG. 14, the passage forming body 12, to which a connection structure 10 according to the fourth embodiment is applied, is an accessory conductor 41 provided so that a high-temperature superconducting wire 50 can be used as the high-temperature superconducting coil 60.

Usually, when the high-temperature superconducting wire 50 is used as the high-temperature superconducting coil 60, a plurality of the high-temperature superconducting wires 50, each formed into a pancake coil 40 (shown in FIG. 10), are stacked and fixed by flanges 43 to be formed as one high-temperature superconducting coil 60.

Further, each pair of the adjacent stacked pancake coils 40 are usually electrically connected to each other at the innermost or outermost periphery thereof.

The accessory conductor 41 is, for example, a connection conductor 41b which connects the pair of adjoining pancake coils 40 to each other at the innermost or outermost periphery thereof.

Further, a lead-out electrode 41a fixed to the flange 43 or the like is connected to each of the pancake coils 40 which are located at both ends of the high-temperature superconducting coil 60 and respectively in contact with the flanges 43.

The lead-out electrode 41a is also the accessory conductor 41 by which a superconducting current 11 flowing through the high-temperature superconducting coil 60 is made to flow into another coil.

An accessory conductor 41 is not limited to the example described above, as long as the accessory conductor 41 is provided to configure the high-temperature superconducting wires 50 to be the high-temperature superconducting coil 60 and to form a path which the superconducting current 11 can flow into.

For example, the accessory conductor 41 may be a winding frame (not shown) and the like.

Figure 15:
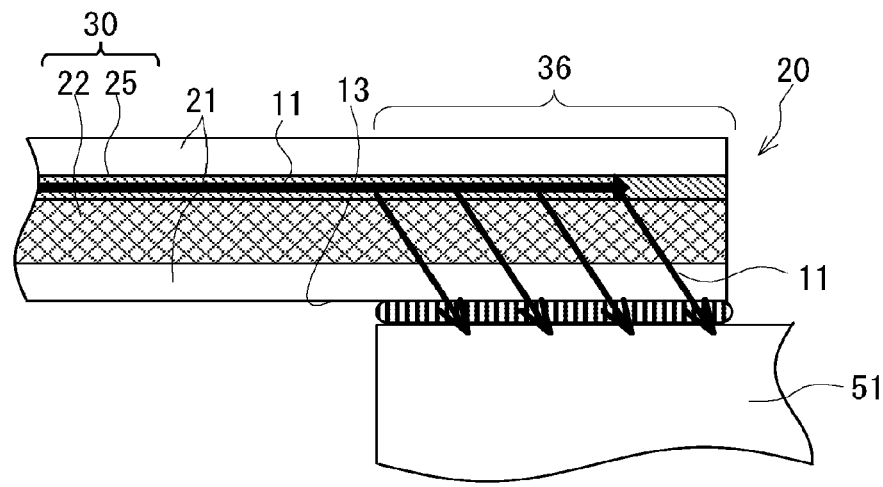
FIG. 15 is a tape longitudinal sectional view showing a connection structure of a multi-layer wire according to a fourth embodiment.

Further, FIG. 15 is a tape longitudinal sectional view showing the connection structure 10 according to the fourth embodiment.

For example, even when a multi-layer wire 20 is connected to the accessory conductor 41 as shown in FIG. 15, similarly to the first embodiment or the like the accessory conductor 41 is bonded to a reverse 13 of the multi-layer wire 20 via a solder 14a provided on the reverse 13.

It should be noted that the coil provided with the accessory conductor 41 is not limited to the configuration formed by the pancake coils 40.

Figure 16:
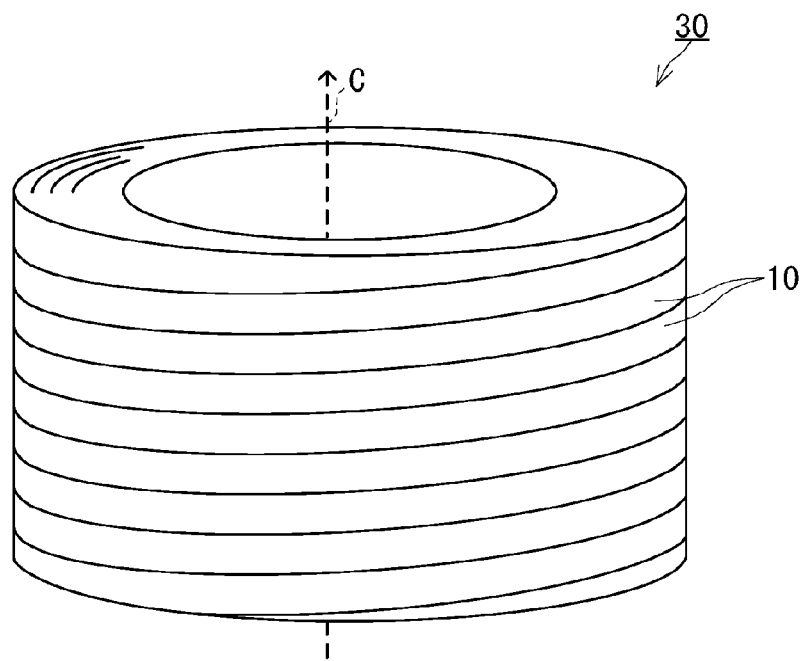
FIG. 16 is a sectional perspective view of an example of a high-temperature superconducting coil to which the connection structure of the multi-layer wire according to the fourth embodiment is applied.

The examples of the coil provided with the accessory conductor 41 include a solenoid type (layer winding) as shown in FIG. 16, a non-circular wound racetrack type, a saddle type and the like but the coil shape is not limited to these.

It should be noted that, except that the multi-layer wire 20 is connected to the accessory conductor 41 by using the connection structure 10, the fourth embodiment has the same structure and the same operating procedures as those of the third embodiment, and hence the duplicate description thereof is omitted.

In the figures, the portions having common configurations or functions are denoted by the same reference numerals and characters, and the duplicate description thereof is omitted.

In this way, with the connection structure 10 according to the fourth embodiment, the decrease of the allowable stress of the multi-layer wire 20 in the tape longitudinal direction can be prevented by electrically connecting the multi-layer wire 20 to the accessory conductors 41.

Further, with the high-temperature superconducting coil 60 manufactured by using the connection structure 10, it is possible to prevent that the rate of occurrence of thermal runaway is increased in the connection of multi-layer wire 20.

Fifth Embodiment

Figure 17:
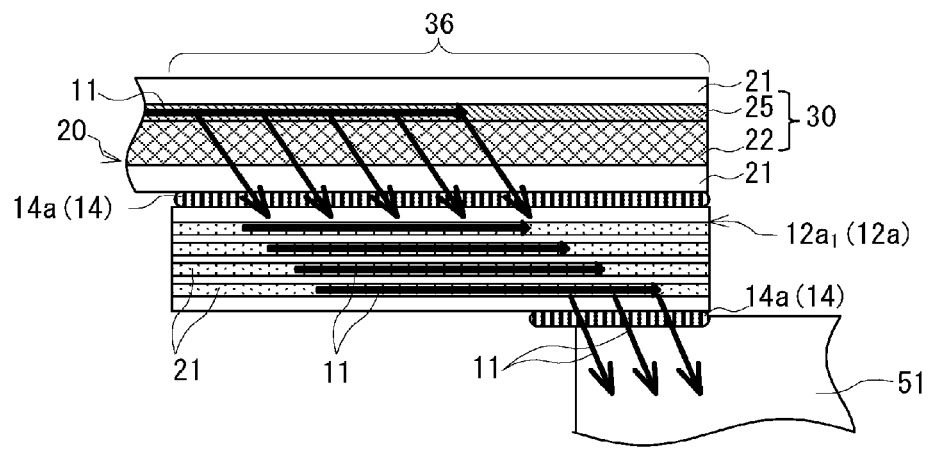
FIG. 17 is a tape longitudinal sectional view showing a connection structure of a multi-layer wire according to a fifth embodiment.

FIG. 17 is a tape longitudinal sectional view showing a connection structure 10 according to a fifth embodiment.

As shown in FIG. 17, in the connection structure 10 according to the fifth embodiment, a wire piece $12_1$ as a passage forming body 12 is used for connecting a multi-layer wire 20 to accessory conductors 41.

Similarly to the description in the fourth embodiment, the accessory conductors 41 are, for example, a lead-out electrode 41a or the connected conductors 41b. Similarly to the second embodiment and the like, a silver sheathed wire 12a is used suitably for the wire piece $12_1$, and the wire piece $12_1$ is bonded to a reverse 13 by a solder 14a.

The accessory conductors 41 are the lead-out electrode 41a, the connection conductor 41b or the like and hence the shape of the accessory conductors 41 is restricted in the coil design.

When the multi-layer wire 20 is connected to the accessory conductors 41, a connection region 36 cannot be easily expanded as in the case where the pieces of multi-layer wire 20 are connected to each other in the third embodiment.

In the case where the multi-layer wire 20 is connected to the accessory conductor 41 via the wire piece $12_1$, however, the connection resistance can be reduced even when the connection region 36 is small because of the same reason as that in the second embodiment.

Further, when the multi-layer wire 20 is connected to the accessory conductor 41 via the wire piece $12_1$, the multi-layer wire 20 is wound by making one of the reverse 13 and the obverse 19 faces outside.

For example, when the lead-out electrode 41a arranged on the outer periphery of the high-temperature superconducting coil 60 shown in FIG. 14 is directly bonded to the reverse 13, the reverse 13 of the multi-layer wire 20 is arranged to face outside.

On the other hand, when the bridge connection is provided with the wire piece $12_1$, the obverse 19 is made to face outside, and the lead-out electrode 41a is electrically connected to the reverse 13.

That is, when the direction of the obverse 19 is important in such a case where it is necessary to prevent the electromagnetic force from acting on a laminated body 30 in the peeling direction, the freedom of design can be increased.

Figure 18:
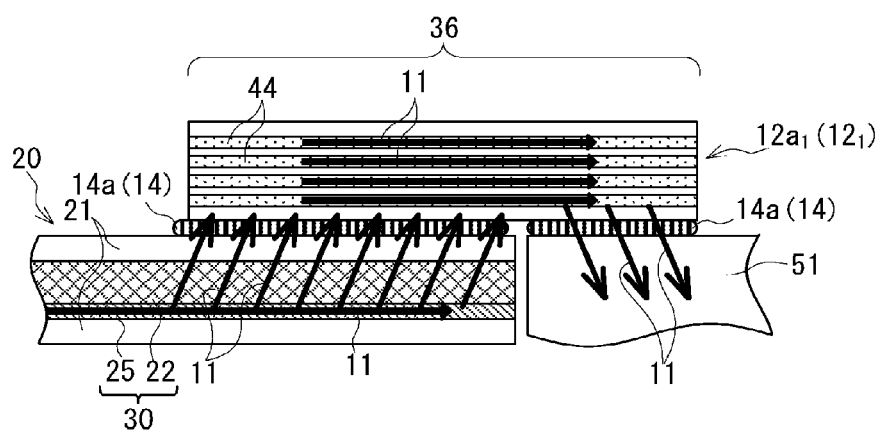
FIG. 18 is a tape longitudinal sectional view showing a modification of the connection structure of the multi-layer wire according to the fifth embodiment.
Figure 19:
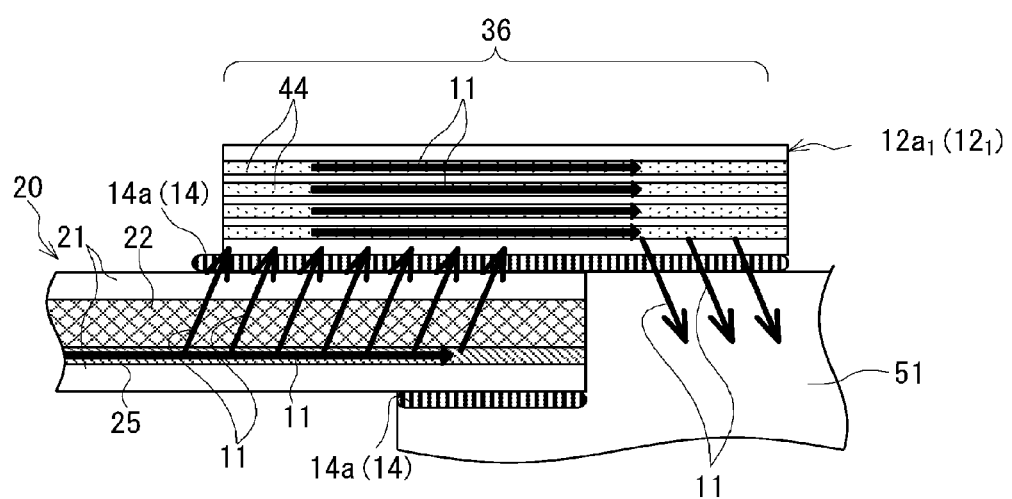
FIG. 19 is a tape longitudinal sectional view showing a modification of the connection structure of the multi-layer wire according to the fifth embodiment.

Each of FIG. 18 and FIG. 19 is a tape longitudinal sectional view showing a modification of the connection structure 10 according to the fifth embodiment.

Each of FIG. 18 and FIG. 19 is an example in which the multi-layer wire 20 and the accessory conductor 41 are bridge-connected to each other in the manner described in the second embodiment.

The reference numerals of the reverse 13 and the obverse 19 are omitted for the sake of simplicity in FIG. 17 to FIG. 19.

As shown in FIG. 18, a portion in which the pieces of the multi-layer wire 20 are connected to each other only by the wire piece $12_1$ and do not overlap each other may be connected with a reinforcing material 38 (FIG. 13) in the case where the portion is the defects in terms of mechanical strength for the high-temperature superconducting wire 50.

In the case where the reinforcing material 38 is connected to the obverse 19 similarly to the second embodiment, even when the laminated body 30 is destroyed at both end portions connected to the reinforcing material 38, the superconducting current 11 flows through the wire piece $12_1$ so as to bypass the portions, and hence the function as the superconducting coil is not lost.

It should be noted that, except that the multi-layer wire 20 is connected to the accessory conductor 41 by using the connection structure 10 provided with the wire piece $12_1$, the fifth embodiment has the same structure and the same operating procedures as those of the fourth embodiment, and hence the duplicate description thereof is omitted.

In the figures, the portions having common configurations or functions are denoted by the same reference numerals and characters, and the duplicate description thereof is omitted. In this way, with the connection structure 10 according to the fifth embodiment, the multi-layer wire 20 is connected to the accessory conductor 41 via the wire piece $12_1$, and hence, even when the length of the accessory conductor 41 are limited, the connection structure 10 with low connection resistance can be obtained.

Further, when the bridge connection is provided with the wire piece $12_1$, the direction of the reverse 13 can be freely determined, and thereby the freedom of design can be increased.

With the connection structure 10 according to at least one of the embodiments described above, the bonding material 14 is lay on the reverse 13 of the multi-layer wire 20, and thereby it is possible to prevent that the allowable stress is reduced due to extension or connection of the multi-layer wire 20.

It should be noted that, although some embodiments of the present invention have been described above, these embodiments are presented as examples, and are not intended to limit the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and sprit of the inventions.

What is claimed is:

1. A connection structure of a high-temperature superconducting wire piece, comprising:
   a substrate;
   a high-temperature superconducting layer formed on one surface of the substrate;
   a tape-type laminated body including at least the substrate and the high-temperature superconducting layer;
   a conductor layer covering an outer periphery of the tape-type laminated body; and
   a passage forming body serving as a flowing path of a superconducting current generated in the high-temperature superconducting wire piece, wherein
   the passage forming body is bonded by a bonding material arranged on a side surface of the conductor layer, the side surface being located on an opposite side to the high-temperature superconducting layer with respect to the substrate.

2. The connection structure of the high-temperature superconducting wire piece according to claim 1, wherein
   the passage forming body is a second high-temperature superconducting wire piece,
   the second high-temperature superconducting wire piece includes a second substrate, a second high-temperature superconducting layer formed on one surface of the second substrate, a second tape-type laminated body including at least the second substrate and the second high-temperature superconducting layer, and a second conductor layer covering an outer periphery of the second tape-type laminated body, and
   the bonding material is arranged on a side surface of the second conductor layer, the side surface being located on an opposite side to the second high-temperature superconducting layer with respect to the second substrate.

3. The connection structure of the high-temperature superconducting wire piece according to claim 1, wherein
   the passage forming body is a lead-out electrode which is connected to an end portion of the high-temperature superconducting wire pieces wound into a coil to allow the superconducting current to flow to the outside of the coil.

4. The connection structure of the high-temperature superconducting wire piece according to claim 1, wherein
   the passage forming body is a connection conductor which electrically connects two coils, each coil being formed by winding the high-temperature superconducting wire piece.

5. The connection structure of the high-temperature superconducting wire piece according to claim 1, wherein
   the passage forming body is a high-temperature superconductivity silver sheathed wire.

6. The connection structure of the high-temperature superconducting wire piece according to claim 5, wherein
   the passage forming body is a wire piece whose length along a tape longitudinal direction of the high-temperature superconducting wire piece is 50 times or less than a length in a direction perpendicular to the tape longitudinal direction.

7. A high-temperature superconducting wire using the connection structure of the high-temperature superconducting wire piece according to claim 1.

8. The high-temperature superconducting wire according to claim 7, comprising a connection structure in which the side surfaces of two or more of the high-temperature superconducting wire pieces are arranged in a same direction and are connected to each other by the wire piece.

9. A high-temperature superconducting coil using the connection structure of the high-temperature superconducting wire piece according to claim 1.

* * * * *